(12) United States Patent
Braun et al.

(10) Patent No.: US 11,873,120 B2
(45) Date of Patent: Jan. 16, 2024

(54) LOW EARTH ORBIT MECHANICAL DEPLOYABLE STRUCTURE

(71) Applicant: AST & Science, LLC, Miami, FL (US)

(72) Inventors: Avi Braun, Ramat Ha Sharon (IL); Aitor Martinez De Osaba Fernandez, Barcelona (ES); Javier Hernandez Bahlsen, Esplugues de LLobregart (ES); Abel Avellan, Coral Gables, FL (US); Huiwen Yao, Potomac, MD (US); Adam H. Halperin, Silver Spring, MD (US); Mariano T. Gomez, Sunny Isles, FL (US)

(73) Assignee: AST & Science, LLC, Midland, TX (US)

( * ) Notice: Subject to any disclaimer, the term of this patent is extended or adjusted under 35 U.S.C. 154(b) by 457 days.

(21) Appl. No.: 16/875,646

(22) Filed: May 15, 2020

(65) Prior Publication Data

US 2020/0361635 A1 Nov. 19, 2020

Related U.S. Application Data

(60) Provisional application No. 62/848,317, filed on May 15, 2019, provisional application No. 62/977,864, (Continued)

(51) Int. Cl.
*H01Q 1/28* (2006.01)
*B64G 1/10* (2006.01)
(Continued)

(52) U.S. Cl.
CPC .......... *B64G 1/222* (2013.01); *B64G 1/1007* (2013.01); *B64G 1/443* (2013.01); *H01Q 1/02* (2013.01);
(Continued)

(58) Field of Classification Search
CPC ........ H04B 7/15; H04B 7/185; H04B 7/1851; B64G 1/1007; B64G 1/222; H01Q 1/02; (Continued)

(56) References Cited

U.S. PATENT DOCUMENTS 4,063,246 A 12/1977 Greiser
4,843,397 A 6/1989 Galati et al.
(Continued)

FOREIGN PATENT DOCUMENTS

CA 3058733 A1 * 4/2020 ............. B64G 1/222
CN 103731935 A 4/2014
(Continued)

OTHER PUBLICATIONS

International Search Report issued in PCT/US2020/33321 dated Sep. 28, 2020.
(Continued)

*Primary Examiner* — Blane J Jackson
(74) *Attorney, Agent, or Firm* — Shumaker & Sieffert, P.A.

(57) ABSTRACT

An antenna array has a plurality of square or rectangular antenna assemblies. Each assembly includes a first antenna assembly surface with a solar cell and a second antenna assembly with one or more antenna elements. The antenna assemblies are interconnected without gaps therebetween to form a first contiguous array surface comprised of the first antenna assembly surfaces and a second contiguous array surface comprised of the second antenna assembly surfaces. The antenna assemblies are connected together by mechanically stored-energy connectors, such as spring tape, that self-deploy the array in space without the use of electric energy.

16 Claims, 4 Drawing Sheets

Related U.S. Application Data filed on Feb. 18, 2020, provisional application No. 62/977,860, filed on Feb. 18, 2020, provisional application No. 62/978,081, filed on Feb. 18, 2020.

(51) Int. Cl.

| | | |
|---|---|---|
| *B64G 1/22* | (2006.01) | |
| *B64G 1/44* | (2006.01) | |
| *H02S 10/40* | (2014.01) | |
| *H02S 40/42* | (2014.01) | |
| *H01Q 1/02* | (2006.01) | |
| *H02S 40/30* | (2014.01) | |
| *H02S 40/36* | (2014.01) | |
| *H01Q 21/00* | (2006.01) | |

(52) U.S. Cl.
CPC ............ *H01Q 1/286* (2013.01); *H01Q 1/288* (2013.01); *H01Q 21/0025* (2013.01); *H02S 10/40* (2014.12); *H02S 40/30* (2014.12); *H02S 40/36* (2014.12); *H02S 40/425* (2014.12)

(58) Field of Classification Search
CPC .......... H01Q 1/08; H01Q 1/12; H01Q 1/1235; H01Q 1/22; H01Q 1/288; H01Q 1/28; H02S 40/425; H02S 4/30; H02S 4/36
See application file for complete search history.

(56) References Cited

U.S. PATENT DOCUMENTS

| | | | |
|---|---|---|---|
| 5,196,857 A | 3/1993 | Chiappetta et al. | |
| 5,386,953 A | 2/1995 | Stuart | |
| 5,465,096 A | 11/1995 | Nawata | |
| 5,666,127 A | 9/1997 | Kochiyama et al. | |
| 5,810,297 A | 9/1998 | Basuthakur | |
| 5,909,299 A | 6/1999 | Sheldon, Jr. et al. | |
| 5,925,092 A | 7/1999 | Swan et al. | |
| 6,087,991 A | 7/2000 | Kustas | |
| 6,157,642 A | 12/2000 | Sturza et al. | |
| 6,314,269 B1 | 11/2001 | Hart | |
| 6,590,150 B1 | 7/2003 | Kiefer | |
| 6,923,249 B1 | 8/2005 | Porter et al. | |
| 6,975,582 B1 | 12/2005 | Karabinis | |
| 6,990,314 B1 | 1/2006 | Hagen | |
| 7,357,356 B1 | 4/2008 | Goodzeit | |
| 7,583,506 B1 | 9/2009 | Huang et al. | |
| 8,736,108 B1 | 5/2014 | Nielson et al. | |
| 8,757,554 B1* | 6/2014 | Harvey ................... B64G 1/44 244/172.7 | |
| 9,150,313 B2 | 10/2015 | Puig-Suari et al. | |
| 9,248,924 B2 | 2/2016 | Puig-Suari et al. | |
| 9,473,234 B2 | 10/2016 | Shreve et al. | |
| 9,570,795 B1 | 2/2017 | Bruce et al. | |
| 9,664,726 B2 | 5/2017 | Platzer et al. | |
| 9,673,889 B2 | 6/2017 | Platzer et al. | |
| 9,815,573 B2 | 11/2017 | Woods | |
| 9,973,266 B1 | 5/2018 | Avellan et al. | |
| 10,368,251 B1* | 7/2019 | Olds ................... H04W 16/28 | |
| 10,526,782 B1* | 1/2020 | Johnson ................ E04B 2/7405 | |
| 11,021,270 B2 | 6/2021 | Honour et al. | |
| 11,683,009 B2 | 6/2023 | Hernandez Bahlsen et al. | |
| 2001/0034206 A1 | 10/2001 | Thompson | |
| 2002/0102939 A1 | 8/2002 | Shaneyfelt | |
| 2005/0248491 A1 | 11/2005 | Leyre et al. | |
| 2007/0155318 A1 | 7/2007 | Monte | |
| 2007/0184778 A1 | 8/2007 | Mechaley | |
| 2007/0250267 A1 | 10/2007 | Jaeger | |
| 2008/0055177 A1 | 3/2008 | Dixon | |
| 2008/0087769 A1 | 4/2008 | Johnson | |
| 2008/0122690 A1 | 5/2008 | Wan | |
| 2010/0046853 A1 | 2/2010 | Goodnough | |
| 2011/0023484 A1 | 2/2011 | Lu et al. | |
| 2011/0063189 A1 | 3/2011 | Cohen et al. | |
| 2012/0217348 A1 | 8/2012 | Aguirre Martinez | |
| 2012/0227916 A1 | 9/2012 | Kellberg | |
| 2012/0287018 A1 | 11/2012 | Parsche | |
| 2012/0325974 A1 | 12/2012 | Baudasse et al. | |
| 2013/0009851 A1 | 1/2013 | Danesh | |
| 2013/0113996 A1 | 5/2013 | Zhu | |
| 2013/0148696 A1 | 6/2013 | Ryu | |
| 2014/0266872 A1 | 9/2014 | Mitola, III | |
| 2015/0162656 A1 | 6/2015 | Fitz-Coy et al. | |
| 2015/0180114 A1 | 6/2015 | Achour | |
| 2015/0217876 A1 | 8/2015 | Halsband | |
| 2015/0249462 A1 | 9/2015 | Chang | |
| 2015/0255861 A1 | 9/2015 | Cohen et al. | |
| 2015/0371431 A1 | 12/2015 | Korb | |
| 2016/0011318 A1 | 1/2016 | Cohen | |
| 2016/0056321 A1 | 2/2016 | Atwater et al. | |
| 2016/0065006 A1 | 3/2016 | Woods | |
| 2016/0251092 A1 | 9/2016 | Cappaert et al. | |
| 2016/0253284 A1 | 9/2016 | Cappaert et al. | |
| 2017/0021947 A1 | 1/2017 | Pelligrino et al. | |
| 2017/0043885 A1 | 2/2017 | Marchandise et al. | |
| 2017/0070939 A1 | 3/2017 | Chong et al. | |
| 2017/0099095 A1 | 4/2017 | Wang | |
| 2017/0214144 A1 | 7/2017 | Cohen et al. | |
| 2017/0250751 A1 | 8/2017 | Kargieman | |
| 2017/0254905 A1 | 9/2017 | Reis | |
| 2017/0285178 A1 | 10/2017 | Platzer | |
| 2017/0300654 A1 | 10/2017 | Stein | |
| 2018/0142729 A1* | 5/2018 | Lee ........................... F16F 3/02 | |
| 2019/0039758 A1* | 2/2019 | Fuller ................... H01Q 15/161 | |
| 2019/0238216 A1 | 8/2019 | Avellan et al. | |
| 2019/0315500 A1* | 10/2019 | Duong ................... B64G 1/506 | |
| 2019/0367194 A1* | 12/2019 | Oh ........................... H05K 3/366 | |
| 2020/0108951 A1* | 4/2020 | Cahoy ...................... E05C 3/02 | |
| 2020/0366237 A1 | 11/2020 | Hernandez Bahlsen et al. | |
| 2021/0276736 A1 | 9/2021 | Honour et al. | |
| 2021/0339894 A1* | 11/2021 | Murphey ............... B64G 1/407 | |

FOREIGN PATENT DOCUMENTS

| | | | | |
|---|---|---|---|---|
| EP | 3109659 A1 | 12/2016 | | |
| GB | 2536017 A | 9/2016 | | |
| KR | 1468997 B1 * | 12/2014 | | |
| WO | WO-2018059821 A1 * | 4/2018 | ............. | G01R 29/10 |
| WO | WO-2019171062 A1 * | 9/2019 | ............. | B64G 1/00 |
| WO | WO-2021084592 A1 * | 5/2021 | ............. | H04B 7/06 |

OTHER PUBLICATIONS

International Search Report and Written Opinion for PCT/US2020/033221, dated Sep. 28, 2020.
International Search Report for PCT/US20/33225, dated Aug. 12, 2020, 13 pages.
International Search Report for PCT/US20/33231, dated Aug. 11, 2020, 16 pages.
Examination Report for EP Application No. 17192639.7, dated Sep. 28, 2018, 5 pages.
International Search Report and Written Opinion for PCT/US18/36929, dated Aug. 31, 2018, 11 pages.
Rainey K., "CubeSats: Shaping Possibilities in Space," Feb. 22, 2017, https://www.nasa.gov/mission_pages/station/research/news/cubesats_possibilites, 3 pages.
Williams, K., "NASA Small Satellites to Demonstrate Swarm Communications and Autonomy," Dec. 7, 2015, https://www.nasa.gov/feature/nasa-small-satellites-to-demonstrate-swarm-communications-and-autonomy, 2 pages.
Gaudin S., "Swarms of smart nano-satellites may offer global connectivity (with video)," Sep. 15, 2015, Computerworld, https://www.computerworld.com/article/2983637/emerging-technology-swarms-of-smart-nano-satellites-may-offer-global-connectivity-with-video-html, 6 pages.
"ISRO sets new world record, successfully puts 104 satellites into Earth's orbit," India TV News Desk, Feb. 15, 2017, http://www,.indiatvnews.com/news/india-countdown-begins-india-to-launch-record-104-satellites-on-single-rocket-368925, 8 pages.
Konechy G., "Small Satellites—A tool for Earth observation?" Jan. 2004, https://www.researchgate.net/publication/229028414_Small_satellites-A_tool_for_Earth_observation?, 4 pages.

(56) References Cited

OTHER PUBLICATIONS

NODES—Spacecraft network operations demonstration using multiple spacecraft in an autonomously configured space network allowing crosslink communications and multipoint scientific measurements, National Aeronautics and Space Administration, www.nasa.gov, Aug. 1, 2016, 2 pages.

Extended Search Report from counterpart European Application No. 20805388.4 dated May 24, 2023, 8 pp.

International Preliminary Report on Patentability from International Application No. PCT/US2020/033221 dated Nov. 16, 2021, 8 pp.

U.S. Appl. No. 18/317,673, filed May 15, 2023, naming inventors Honour et al.

* cited by examiner

LOW EARTH ORBIT MECHANICAL DEPLOYABLE STRUCTURE

RELATED APPLICATIONS

This application claims the benefit of priority of U.S. Application No. 62/848,317, filed on May 15, 2019, Spanish Application No. 202030123, filed on Feb. 13, 2020, and U.S. Application No. 62/977,864 filed on Feb. 18, 2020. This application also claims priority to Spanish Application No. 02030124, filed on Feb. 13, 2020, Spanish Application No. 202030125, filed Feb. 13, 2020, U.S. Application No. 62/977,860, filed Feb. 18, 2020, and U.S. Application No. 62/978,081, filed Feb. 18, 2020. The content of those applications is relied upon and incorporated herein by reference in their entireties. The present application further incorporates by reference the content of U.S. Application Ser. No. 16/875,703, titled Solar, Electric, RF Radiator for Self-Contained Structure for Space Application Array, filed May 15, 2020, and U.S. Application Ser. No. 16/875,738, titled Thermal Management System for Structures in Space, filed May 15, 2020.

BACKGROUND

Figure 1A:
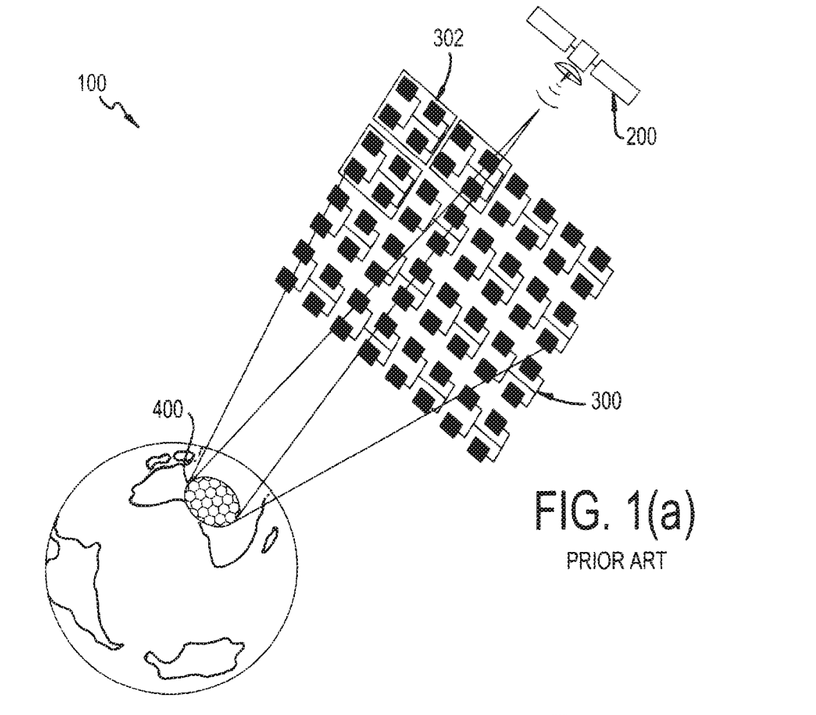
FIGS. 1(a), 1(b) show a conventional structural array.
Figure 1B:
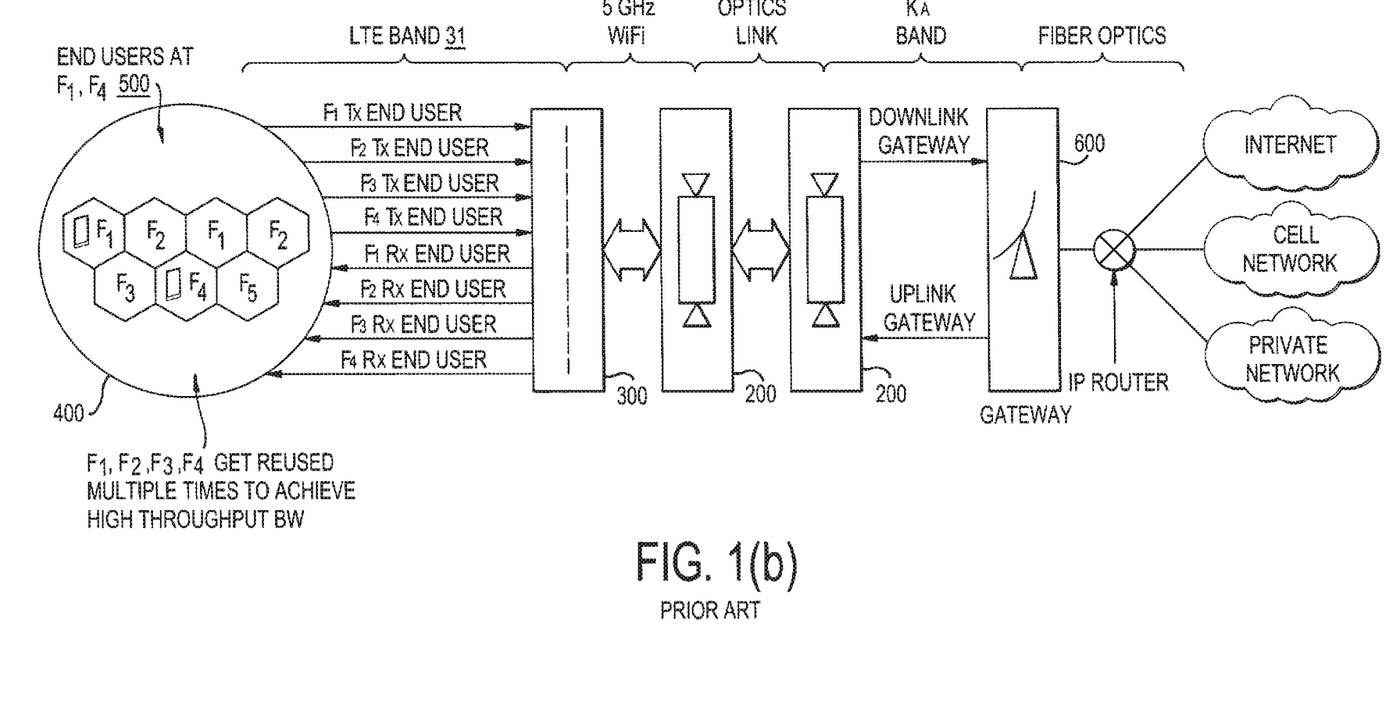

U.S. Pat. No. 9,973,266 and U.S. Publ. No. 2019/0238216 show a system for assembling a large number of small satellite antenna assemblies in space to form a large array. The entire content of the '266 patent is incorporated herein by reference. As disclosed in the '266 patent, FIGS. 1(a), 1(b) show a satellite communication system 100 having an array 300 of small satellites 302 and a central or control satellite 200. The small satellites 302 communicate with end users 500 within a footprint 400 on Earth, and also communicate with the control satellite 200, which in turn communicates with a gateway 600 at a base station. The small satellites 302 can each include, for example, a processing device (e.g., a processor or controller) and one or more antenna elements. And the control satellite 200 can include a processing device and one or more antenna or antenna elements.

SUMMARY

An antenna array has a plurality of square or rectangular antenna assemblies. Each assembly includes a first antenna assembly surface with a solar cell and a second antenna assembly with one or more antenna elements. The antenna assemblies are interconnected without gaps therebetween to form a first contiguous array surface comprised of the first antenna assembly surfaces and a second contiguous array surface comprised of the second antenna assembly surfaces.

DETAILED DESCRIPTION

In describing the illustrative, non-limiting embodiments of the disclosure illustrated in the drawings, specific terminology will be resorted to for the sake of clarity. However, the disclosure is not intended to be limited to the specific terms so selected, and it is to be understood that each specific term includes all technical equivalents that operate in similar manner to accomplish a similar purpose. Several embodiments of the disclosure are described for illustrative purposes, it being understood that the disclosure may be embodied in other forms not specifically shown in the drawings.

Figure 2:
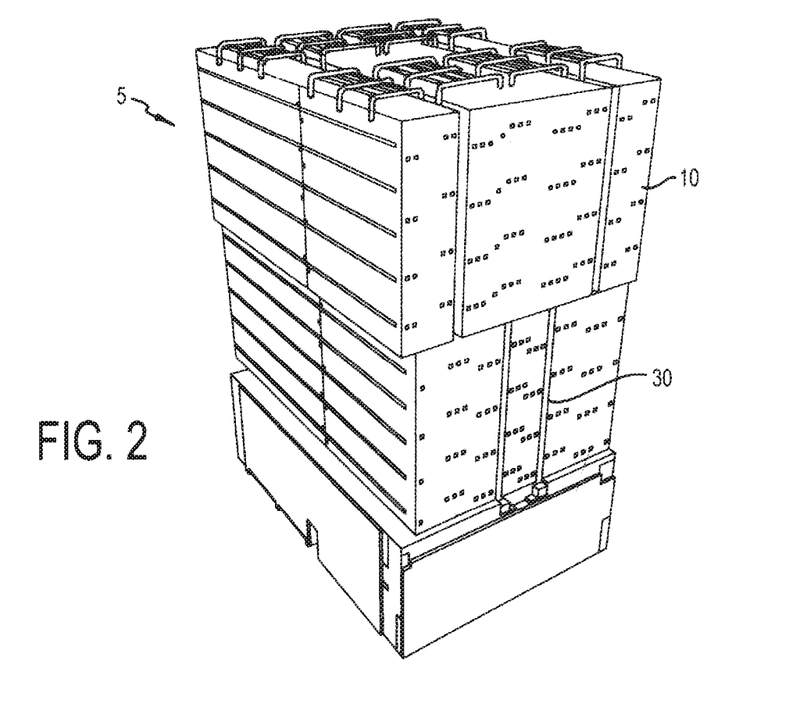
FIG. 2 is a perspective view of a structural array in a stowed configuration.

Turning to FIG. 2, the present disclosure is a Low Earth Orbit (LEO) Mechanical Deployable Structure (LMDS) 5. The LMDS 5 is a self-deployable structure for space applications formed by a plurality of discrete antenna assemblies 10, referred to here as remote satellite modules or just panels or tiles 10, all of them mechanically connected by a connection or interconnection assembly. The LMDS 5 is a satellite system having one or more remote satellite modules or assemblies, in the form of tiles 10, that together form a single large phase array in space. Each satellite module assembly has a plurality of satellite tiles 10 that are mechanically connected together by one or more hinges. A plurality of satellite module assemblies can also be connected in space to form the single large phase array having a single orbital inclination and/or single aperture.

Figure 3A:
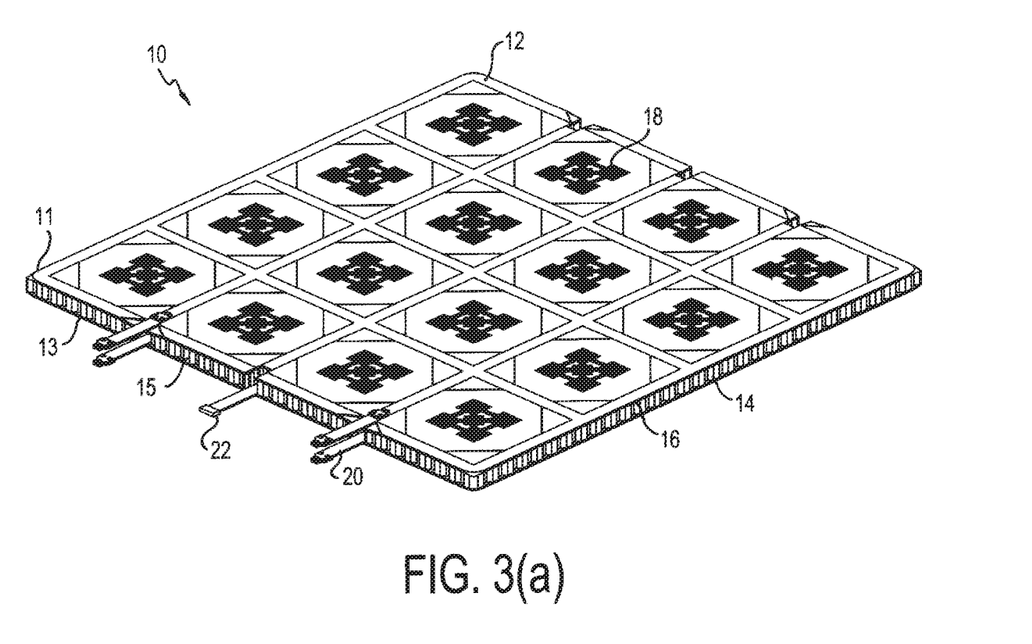
FIG. 3(a) is a perspective view of a 1×1 structural element of the structural array of FIGS. 2(a), 2(b)

In one example embodiment shown in FIG. 3(a), the tiles 10 are individually separate and distinct, and are square and/or rectangular in shape. The tiles 10 are thin and have an outer layer 11, inner layer 13, and middle layer 15. The outer layer 11 can be formed by a first thin plate with a square or rectangular first planar side 12 (here shown as top plate 11 with a top or top surface 12) with a first side surface. The inner layer 13 can be formed by a second thin plate 13 having a second planar side 14 (here shown as a bottom plate 13 with a bottom or bottom surface 14) opposite the first side 12 and having a second side surface. The middle layer can be formed by a middle structure, such as a honeycomb support structure 15, that is positioned at the interior of the tile 10 between the first plate 11 and the second plate 13. The inner, outer and middle layers have four lateral sides or side edges 16. The tiles 10 have a rectangular cross-section that forms the shape of the lateral sides 16 that define the tile thickness which is substantially less than the length and/or width of the tile 10. The first and second plates 11, 13 and the support structure 15 are lightweight. The support structure 15 provides structural support to the first and second plates 11, 13. However, in other embodiments, a support structure 15 need not be provided.

The deployable structure 5 can be launched in a stowed configuration (FIG. 2) and deployed to a large deployed configuration (FIG. 1(a)) once in orbit (e.g., under no gravity conditions). In the stowed configuration, the tiles 10 are in a compact form that can be transported to space. The tiles 10 can be arranged in any suitable manner, such as for example folded onto each other so that the tiles 10 are in stacked arrangement with the top surface 12 of one tile facing and parallel to the top or bottom surface 12, 14 of another tile 10, though one or more of the tiles 10 can also optionally be positioned orthogonal to other tiles 10. In the deployed configuration (e.g., FIG. 1(a)), the tiles 10 are unfolded and substantially planar with one another to form a structural array. Thus, the antenna 18 is received in a recess of the top plate 11 so that the top of the antenna 18 is flush with the top surface 12 of the top plate 11 to form a planar top surface 12. And the solar cells can be positioned in a recess of the bottom plate 13 so that the top surface of the solar cells are flush with the bottom surface 14 to form a planar bottom surface 14. Thus, the top and bottom surfaces 12, 14 can come together in the stowed configuration without gaps or spacing therebetween. In accordance with one embodiment of the present disclosure, the tiles form a contiguous uniform uninterrupted surface.

The LMDS 5 can be utilized for a number of applications, including for example an antenna, reflector, or data center. FIGS. 3(a)-3(d) show one embodiment of the LMDS 5 utilized for an antenna, and the plurality of tiles 10 are antenna assemblies. Each antenna assembly 10 represents a small satellite (also referred to here as a micron) and has one or more antenna elements 18 and a processing device (e.g., processor or controller). The antenna assemblies 10 are connected together by an interconnection assembly having one or more mechanical connectors 20, electrical connectors 22 that enable power and/or data transfer between the antenna assemblies 10, and one or more latches that retain the structure 5 in the stowed configuration (FIG. 2). The electrical connector 22 electronically connects the electronic components (e.g., processing device, sensors, actuators, power) of adjacent tiles 10. Thus, the array of tiles 10 is modular, and the size and shape of the array can be adjusted by adding or removing tiles 10.

The structure 5 deploys in a passive way, for example, the antenna assemblies 10 are connected by stored-energy connectors 20. The stored-energy connectors 20 have a stored-energy position and a released-energy position. In the folded stowed configuration of the array of antenna assemblies 10 (FIG. 2(a)), the stored-energy connectors 20 are in the stored-energy position, where they retain mechanical energy and are biased outward to the released-energy position. In the unfolded deployed configuration of the array of antenna assemblies 10 (FIG. 2), the stored-energy connectors 20 are in the released-energy position. For example, in one embodiment the connectors 20 can mechanically store energy, such as for example an elongated straight one-piece integral spring that is biased outward (i.e., to a linear position). In the stored-energy position, the spring connectors 20 can folded (e.g., curved to fold in half), and in the released-energy position the spring connectors 20 can be unfolded and substantially straight (i.e., linear) or planar. However, the stored-energy connectors 20 need not be a spring, but can be any suitable connector that stores energy, either mechanical or electrical.

The structure 5 is kept in the stowed configuration by one or more mechanical and/or electrical locking mechanisms 30 having a locked state and an unlocked state, such as a latch. The locks can be, for example, a latching system that is positioned on the outer surface of the LMDS 5 when in the stowed position (FIG. 2). Or the locks can be, for example, a mechanism that prevents rotation of the tiles 10. In the locked state, the locks prevent the array of tiles 10 from inadvertently moving from the stowed configuration to the deployed configuration until the locks are placed in the unlocked state. Once the deployment is ready to initiate, the latching is triggered to unlock the folded antenna arrays. For example, the latches can be manually actuated or actuated by a processing device at the antenna assembly 10. Once the latches are unlocked, the stored-energy connectors begin to move the array of antenna assemblies 10 to the deployed configuration in a controlled manner. The energy in the stored-energy connectors 20 begins to release and the stored-energy connectors move toward the released-energy position. As the stored-energy connectors move to the released-energy position, the antenna assemblies 10 unfold from the stowed configuration into the deployed configuration.

The stored-energy connectors 20 are folded into the stored-energy position when the LMDS 5 is on Earth. The LMDS 5 can then be transported into space in the compact stowed configuration. Once in space, the latch(es) are unlocked (e.g., manually or electrically such as by a remotely operated solenoid) and the stored-energy connectors 20 move the antenna assemblies 10 into the deployed configuration utilizing the mechanical power that is stored in the stored-energy connector 20. Thus, in one embodiment where the connectors 20 are mechanical, the antenna array does not require any electric power to move from the stowed configuration to the deployed configuration. In addition, the connectors 20 are positioned to not interfere with operation of the antenna assemblies 10. For example, the connectors 20 are positioned at the side edges 16 of the antenna assemblies 10 so they do not interfere with electrical operations at either the top 12 or bottom 14 of the antenna assembly 10. And, the connectors 20 allow the assemblies 10 to come together in the deployed configuration so that the sides 16 come into contact with one another to form a single contiguous uniform and planar surface without gaps between adjacent antenna assemblies 10.

Connectors 20

Figure 3B:
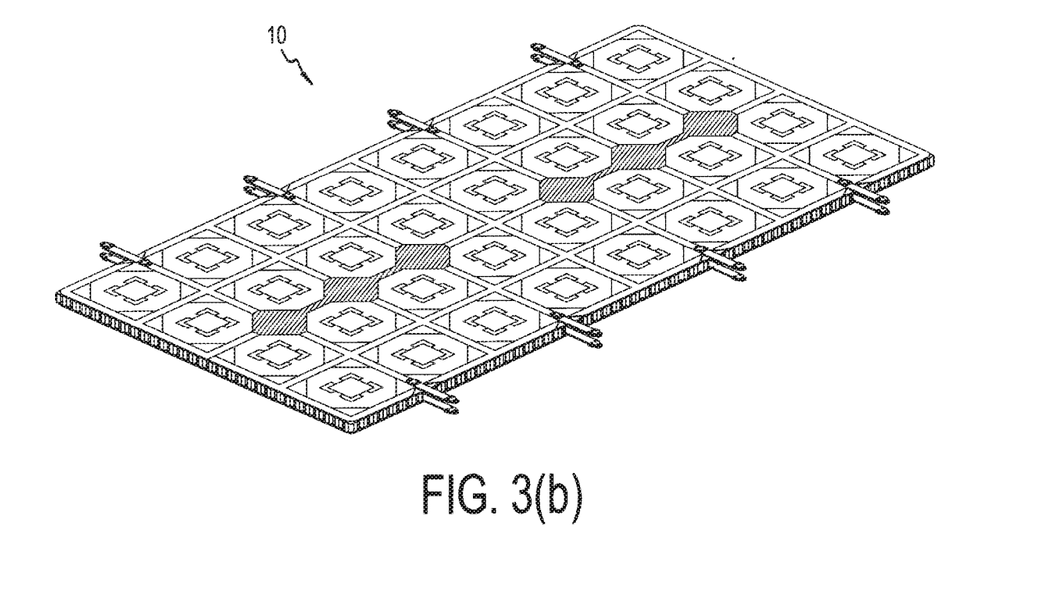
FIG. 3(b) is a perspective view of a 2×1 structural element.
Figure 3C:
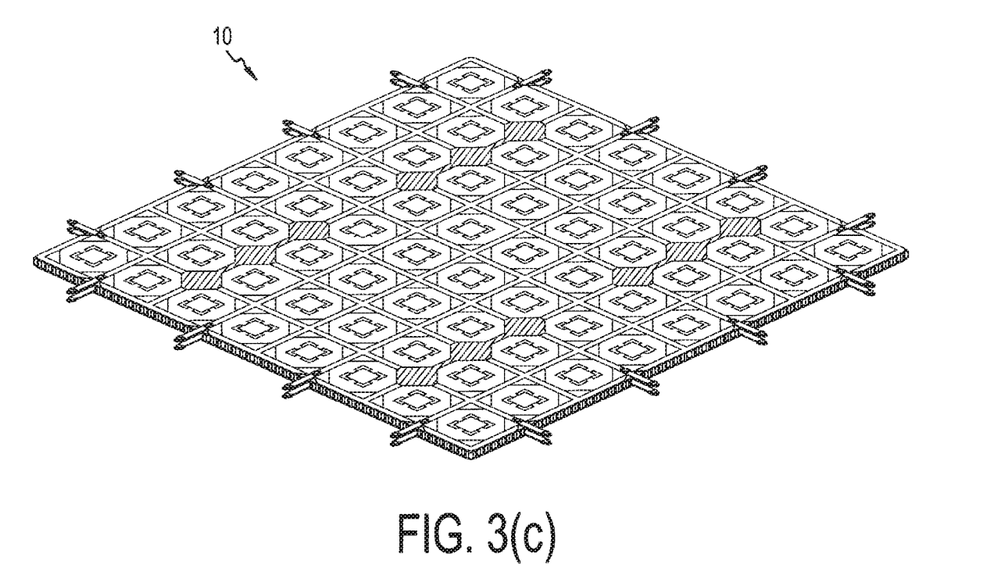
FIG. 3(c) is a perspective view of a 2×2 structural element.
Figure 3D:
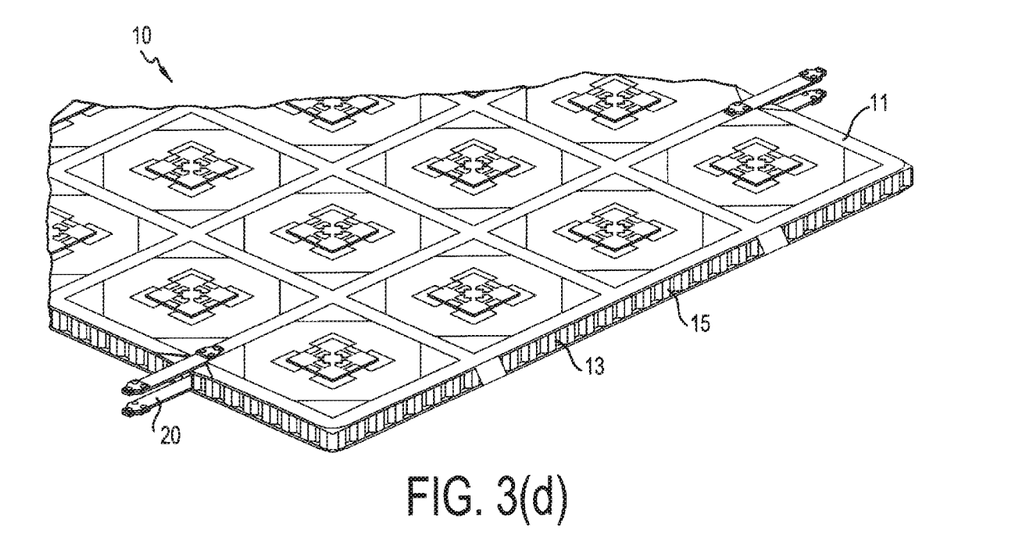
FIG. 3(d) is a detailed view of the spring tape connections.

As shown in FIGS. 3(a)-(d), in one example embodiment, the stored-energy connectors 20 are a tape spring, though other suitable connectors can be utilized. The tape springs can be thin, linear and elongated. They can either be flat (i.e., a linear cross-section) or arcuate (i.e., a curved cross-section). In addition, the interconnection assembly can include other attachment mechanisms, such as latches, joints, hinges or connectors that connect to the tiles 10. The tape springs 20 are spring loaded hinges that once deployed, give the structure a required mechanical stiffness. As best shown in FIG. 3(a), one or more tape springs 20 are provided at one or more of the side edges 16 of the antenna assembly 10. In FIG. 3(d), the tape springs 20 are metal structures that can be curved to create a spring-like bias when folded in the stored-energy position, and a locking force when in the deployed released-energy position. The locking force maintains the antenna assemblies 10 in the deployed configuration and prevent them from returning to the stowed configuration. Thus, the tiles are small separate discrete devices that are physically connected to one another by one or more connectors 20 to form a large array in space.

The connector 20 has sufficient length to connect neighboring tiles 10 when they are folded upon one another in the stowed configuration and substantially parallel to one another, and also in the deployed configuration when they are unfolded and substantially planar with one another. The tape spring connectors 20 deliver energy to deploy the panels and keeps the panels 10 in position once deployed. The connectors 20 can include outwardly biased springs that are biased to spring outward when in the stowed configuration. When the panels 10 are folded upon one another, the connectors 20 are in a bent or folded configuration and are biased outward to be in a straightened or linear position. In the stowed configuration, the springs apply an outward force that facilitates movement of the panels 10 from the stowed configuration to the deployed configuration.

As further illustrated in FIGS. 3(a)-(d), a connector 20 (i.e., the tape spring in the current example embodiment) can be attached (e.g., by fastener(s), adhesive or the like) to both the top surface 12 and the bottom surface 14 of the tile 10. And tape springs 20 on the top surface 12 align with the tape springs 20 on the bottom surface 14. However, the tape springs 20 can be provided at any suitable position at the tile 10, such as between the top and bottom surfaces 12, 14. And, tape springs 20 need not be provided on both the top and bottom surfaces 12, 14, or the tape springs on the top surface 12 need not be aligned with the tape springs on the bottom surface 14.

It is further noted that in the example above, the stored-energy connectors 20 are a spring tape that stores mechanical energy. However, any suitable stored-energy connector can be utilized that mechanically stores energy. In addition, any suitable connector can be utilized that electronically stores energy. In addition, the stored-energy connectors 20 can move the tiles 10 from the stowed configuration to the deployed configuration in any suitable amount of time, from hours to days.

Thus, each tile 10 has at least one connector 20 that mechanically connects the tile 10 to an adjacent tile 10, but at the same time allows the tile 10 to move (e.g., bend, fold, rotate or pivot) with respect to one or more of the other tiles 10, and move between the stowed position and the deployed position.

For example, the connectors 20 allow the top or bottom surface 12, 14 of a first tile 10 to touch the top or bottom surface of an $n^{th}$ tile 10. And, the first tile 10 can be either vertically or horizontally aligned with the $n^{th}$ tile 10, and the first and $n^{th}$ tiles 10 need not be immediately adjacent to an adjacent tile connected by the connector. That is, the first tile can be positioned several tiles away from the $n^{th}$ tile, such that there are intervening tiles between the first and $n^{th}$ tiles. For example, the $n^{th}$ tile can be the second tile, which is immediately adjacent the first tile in the same row or column. Or the $n^{th}$ tile can be the fifth tile, which has three intervening tiles between the first and fifth tiles in the same row or column. Or the $n^{th}$ tile can be the fifth tile, which can be in a different row and column as the first tile. In one embodiment, each tile has two connectors and is mechanically connected to two adjacent tiles.

In a further embodiment of the disclosure, the connector 20 can be a hinge that directly couples a first tile 10 to an immediately adjacent second tile 10. The hinge can be coupled to the inside or outside surfaces of the tiles, or to the middle layer of the tile. The hinge can provide a mechanical and/or electrical connection, though in one embodiment the hinge at least has a mechanical connection and can be controlled electronically to move between the operating configuration and the storage configuration. Any suitable control mechanism can be utilized to control the rotation of the modules, either mechanical and/or electrical. For example, the control mechanism can be a coil that receives an electric current to cause an electromagnetic force, and are positioned on the tiles to control rotation of the tiles 10 with respect to one another.

The electromagnetic forces formed by the coil can cause the tiles 10 to move, and/or can cause the hinges to move. Other suitable control mechanisms can be provided, such as magnets, a biased mechanical spring and/or solenoids. If needed, electrical wires or fibers can pass through the hinges between tiles to carry data such as control signals to control movement of the phase array in space and/or to control movement of the tiles 10 between the operating and storage configurations. In one embodiment, the wire can carry a current that passes through the coils to create a magnetic field that opens the hinge to move the tiles 10 from a storage configuration to an operating configuration. The coils can also be utilized to tilt the phase array to track the sun and/or the pointing of the aperture or to otherwise move the phase array 300. In another embodiment, the connector 20 can include both a tape spring and a hinge at one or more of the side edges of the tiles 10.

LMDS Configuration

The tiles 10 forming the structure 5 can be assembled in different configurations, i.e. 1×1 Tile, 2×1 Tile, 2×2 Tile, etc. as shown in FIGS. 3(a), 3(b), 3(c), respectively. Each of the tiles 10 have a communications face/side, here shown as the top 12, and a solar power face/side, here shown as the bottom 14. The communications side 12 have the antenna elements 18 that conduct radio frequency (RF) communications with user devices on Earth. By the propagation of the tiles 10, this generates the array/structure 5 with one RF side and one solar panel side. The RF side forms a top surface 12 that faces Earth, and the second side forms a bottom surface 14 that faces away from Earth.

In addition, a solar cell can be positioned on the surface (here, the bottom surface 14) that faces away from the Earth. The solar cell receives solar energy from the Sun, especially when the LMDS 5 is between the Earth and the Sun. Thus, one side of the satellite module can have the solar cell and the opposite side can point the antenna in the desired direction. The solar energy can be utilized to power the electronic components of the tile or for array thrust. For example, the tiles can be made from photovoltaic material or other material that converts solar energy to electrical energy to operate as a solar panel, and also operate as an antenna structure (or other structure of the satellite or satellite module) to transmit and receive signals in accordance with the present disclosure. The electrical energy is used to power the satellite or satellite modules or stored for later use. Thus, the same structure can be used for solar energy and for operation as a satellite antenna.

In the deployed position, the tiles are closely arranged and can contact one or more of its neighboring tile. Accordingly, the RF side collectively form the large phase array. The tiles 10 can optionally also house other electronic components, such as a receiver, transmitter or processing device(s). Those electronic components are positioned at the interior (between the top surface and the bottom surface) of the tile so that they do not interfere with the operation of the antenna elements 18 or the formation of the phase array.

To further avoid any interference between the connectors 20 and the RF side 12, the connectors 20 are arranged such that when the structure deploys, the connectors 20 do not obstruct the top surface of the RF side 12. In FIG. 3(a), the tile 10 is a 4×4 array of sixteen antenna elements 18 with two connectors 20 formed at each of two side edges of the tile 10. However, other suitable sizes and dimensions can be utilized. For example, the tile 10 can be formed as a 4×8 array of 32 antenna elements 18, FIG. 3(b), or an 8×8 array of 64 antenna elements 12, FIG. 3(c), and the connector 20 can be located at the outer side edges of the tile 10.

The LMDS 5 is modular and can be designed in many different layout combinations (tile sizes, number of tiles, overall shape, overall size, etc.) but the shape of the tiles is square and rectangular, and all tiles 10 are mechanically interconnected (for each independent deployable area). In one embodiment, the structure will deploy all at once. However, in other embodiments, the structure can deploy in two halves or four quarters. Although the LMDS is especially configured for LEO orbit, it is applicable to any other possible orbit, or on ground.

FIG. 1(a) show the structure 5 having a square shape, though in other applications the structure 5 has a circular shape. In addition, the various sizes, layout and shapes of the individual tiles 10 differ, as well as the numbers of columns and rows of tiles 10 in the array. The overall shape and structure can be changed by adding or removing tiles 10, or by changing the number of rows, columns, size or shape of the tiles.

Latches

In one embodiment of the disclosure, the locking mechanism 30 can be one or more latches. The latches can be micro sized and lightweight and are attached to one or more of the tiles 10. The latches hold down one or more of the tiles 10 and prevent the array 5 from inadvertently moving from the stowed configuration to the deployed configuration. The latches can be any suitable device. In one embodiment, the latches are made of a Shape Memory Alloy (SMA). A small current is passed through the latch, which causes the latch to unlock the array of tiles 10 so that the tiles 10 can move from the folded stowed configuration to the unfolded deployed configuration. Unlocking can be controlled manually by manually moving the latch, pressing a button to remotely activate the latch, or automatically by a processor at one or more of the tiles 10. The latches respond quickly (within milliseconds) and reliably, despite the harsh conditions in space, where temperatures can be −65 to +70 degrees Celsius.

Transportation

In one embodiment of the operating configuration, all of the tiles 10 are arranged in a single plane, i.e., all of the tiles are side by side with the top surfaces in a single plane. And in the storage configuration, all of the connected tiles are aligned and arranged facing one another in a line (single column).

Accordingly, the system has a very large number of satellite tiles that are connected by connectors 20. The tiles 10 can be placed in a storage or transport configuration. The small tiles 10 are separate discrete devices and are physically connected to one another by one or more connectors 20. The tiles can be folded into the transport configuration for storage and transportation and then deployed in space into the large satellite array of the operating configuration.

For example, in the storage configuration, the multiple tiles are folded along the connectors 20 and placed together in a single shipping container such as a box, for transport on a rocket or other transport device or space craft. Once the shipping container(s) reaches a release position in space at a desired orbit, the shipping container can be opened and the tiles can be released into space. The tiles can then automatically maneuver to enter into the operating configuration array in space where it forms a very large and dense array of the satellite tiles.

This greatly reduces the space required by the tiles during transport, but enables the tiles to form a very large array when in the operating configuration. The tiles can take up a space of a few square meters depending on the number of tiles, which converts to many square meters when deployed in space. Thus, the satellite array can be formed with minimal human intervention (such as to release the tiles from the shipping container and space craft, and optionally to unlatch the locking mechanism to initiate self-deployment of the connectors), and can even be formed without any physical human intervention (such as to build a frame or other structure for the array). In addition, multiple tiles can be connected together in space to form a single phase array that is hundreds or thousands of square meters in size.

CONCLUSION

The tiles 10, connectors 20 and locking mechanisms 30 are utilized for the LMDS 5 and deployed in space. However, the tiles 10, connectors 20 and locking mechanisms can be utilized in other structures or applications. And, the LMDS 5 can utilize any suitable tiles, connectors and locking mechanisms, and is not restricted to those shown and described with respect to the illustrative examples. And other suitable positioning of the tiles, connectors and locking mechanism can be provided within the structure as part the LMDS.

It is further noted that the shape and size of the tiles 10 enable them to be placed immediately adjacent to each other in the deployed configuration. That is, all of the sides of the tiles 10 come into direct contact with the respective side of the neighboring adjacent tiles. The connectors enable the tiles to be substantially contiguous with one another to form a single contiguous structure 5 without any gaps between the adjacent tiles 10. The connectors 20 enable (and do not obstruct) adjacent tiles 10 to directly contact one another in the deployed position.

When the LMDS 5 is configured as an antenna array, it (e.g., the antenna elements 18) communicates with processing devices on Earth, such as for example a user device (e.g., cell phone, tablet, computer) and/or a ground station. The present disclosure also includes the method of utilizing the LMDS 5 to communicate with processing devices on Earth (i.e., transmit and/or receive signals to and/or from). The present disclosure also includes the method of processing devices on Earth communicating with the LMDS 5 (i.e., transmit and/or receive signals to and/or from). In addition, while the LMDS 5 is used in Low Earth Orbit (LEO) in the examples disclosed, it can be utilized in other orbits or for other applications. In addition, while the disclosure has been described as for an array of antenna assemblies, the disclosure can be utilized for other applications, such as for example data centers, reflectors, and other structures, both implemented in space or terrestrially.

In one embodiment, the disclosure provides a phase array having a large dense array formed by a plurality of flat discrete satellite modules each having an antenna; a plurality of coils at one or more of the plurality of flat discrete satellite modules, each of said plurality of coils generating an electromagnetic force; said plurality of flat discrete satellite modules interconnected by hinges, wherein the plurality of flat discrete satellite modules have a compact transport configuration for transport to space, and an operating configuration whereby the electromagnetic forces form said plurality of flat discrete satellite modules into a the large dense array in space. In addition, said plurality of flat discrete satellite modules in the operating configuration form a large planar mechanically-interconnected structure. In addition, each of said plurality of flat discrete satellite modules have a solar cell on top and a transmitter on bottom. In addition, the electromagnetic forces pivot said plurality of flat discrete satellite modules about said hinges. In addition, said coil creates a magnetic field that moves the phase array to track the sun or objects on the ground.

In another embodiment, the disclosure provides a phase array having a first module; a second module; a connector connected to the first module and the second module to move the first and second modules between an operating configuration and a storage configuration; and a control mechanism coupled to said connector to move the first and second modules between the operating configuration and the storage configuration. In addition, the first and second modules include an antenna. In addition, said control mechanism comprises a coil and said control mechanism passes a current through said coil to create a magnetic field that moves said first and/or second satellite module to pivot about said connector. In addition, said control mechanism comprises a coil and said control mechanism passes a current through said coil to create a magnetic field that moves the phase array to track the sun or objects on the ground. In addition, said control mechanism comprises a coil and said control mechanism passes a current through said coil to create a magnetic field that moves the phase array to point an aperture formed by the phase array. In addition, said connector comprises a mechanical connector. In addition, an electrical wire or cable passing through said connector. In addition, said first and second modules are flat with a top, bottom and sides, and in the operating configuration are arranged side-by-sides in rows and columns and in the storage configuration are arranged with the tops and/or bottoms facing each other. In addition, said first and second modules are flat with a top, bottom and sides, and having a solar collector on the top and an antenna on the bottom.

In another embodiment, a phase array has a first satellite module; a second satellite module; a mechanical connector comprising a hinge rotatably connected to the first satellite module and the second satellite module to rotate said first satellite module with respect to said second satellite module to move said first and second satellite modules between an operating configuration and a storage configuration; and a control mechanism comprising a coil coupled to said connector to create an electromagnetic field in response to a current passing through said coil, to move the first and second satellite modules about said hinge between the operating configuration and the storage configuration.

It is further noted that the present disclosure can be utilized separately, and can also be utilized in combination with the systems and methods disclosed in U.S. application Ser. No. 16/875,703, titled Solar, Electric, RF Radiator for Self-Contained Structure for Space Application Array, filed May 15, 2020, and U.S. application Ser. No. 16/875,738, titled Thermal Management System for Structures in Space, filed May 15, 2020. Thus, for example, the self-deployable tiles 10 can have structure as shown and described in the Solar, Electric, RE radiator application, and/or can utilize the thermal management as shown and described in the Thermal Management application.

It is further noted that the description and claims use several geometric, relational, directional, positioning terms, such as planar, square, rectangular, linear, flush, elongated, circular, parallel, perpendicular, orthogonal, transverse, flat, side, top, and bottom. Those terms are merely for convenience to facilitate the description based on the embodiments shown in the figures, and are not intended to limit the present disclosure. Thus, it should be recognized that the disclosure and disclosure can be described in other ways without those geometric, relational, directional or positioning terms. In addition, the geometric or relational terms may not be exact. For instance, surfaces may not be exactly flat, planar or parallel but still be considered to be substantially flat, planar or parallel because of, for example, roughness of surfaces, tolerances allowed in manufacturing, forces applied in practice during use, etc. And, other suitable geometries and relationships can be provided without departing from the spirit and scope of the disclosure.

The foregoing description and drawings should be considered as illustrative only of the principles of the disclosure, which may be configured in a variety of ways and is not intended to be limited by the embodiment herein described. Numerous applications of the disclosure will readily occur to those skilled in the art. Therefore, it is not desired to limit the disclosure to the specific examples disclosed or the exact construction and operation shown and described. Rather, all suitable modifications and equivalents may be resorted to, falling within the scope of the disclosure.

The invention claimed is:

1. A structure for space comprising:
   a plurality of tiles having a stowed configuration and a deployed configuration; and
   a plurality of stored-energy connectors connected to adjacent tiles of the plurality of tiles, the plurality of stored-energy connectors configured to store energy in the stowed configuration and configured to release energy to move the plurality of tiles to the deployed configuration, wherein the plurality of stored-energy connectors comprises a first stored-energy connector connected to a first layer of the adjacent tiles and a second stored-energy connector connected to a second layer of the adjacent tiles, the first layer different than the second layer; and
   a control mechanism to control a locking mechanism having a locked position to lock the plurality of tiles in the stowed configuration and an unlocked position to initiate self-deployment by the stored-energy connectors to move the plurality of tiles to the deployed configuration.

2. The structure of claim 1, the stored energy of the plurality of stored-energy connectors comprising mechanical energy.

3. The structure of claim 1, the plurality of stored-energy connectors each comprising a spring connector.

4. The structure of claim 3, wherein the spring connector comprises a tape spring.

5. The structure of claim 1, the structure communicating with a processing device on Earth.

6. The structure of claim 1, wherein the control mechanism comprises one or more of a solenoid, a coil, or a magnet.

7. The structure of claim 1,
   wherein the first layer of the adjacent tiles comprises one or more antennas, and
   wherein the second layer of the adjacent tiles comprises one or more solar cells.

8. An antenna array comprising:
   a plurality of antenna assemblies each having one or more antennas, the plurality of antenna assemblies having a stowed configuration and a deployed configuration;
   a plurality of stored-energy connectors connecting adjacent antenna assemblies of the plurality of antenna assemblies, the stored-energy connectors configured to store energy in the stored-energy position and configured to release energy in a released-energy position to move the plurality of antenna assemblies to the deployed configuration, wherein the plurality of stored-energy connectors comprises a first stored-energy connector connected to a first layer of the adjacent antenna assemblies and a second stored-energy connector connected to a second layer of the adjacent antenna assemblies, the first layer different than the second layer; and
   a control mechanism configured to control a locking mechanism having a locked position to lock the plurality of antenna assemblies in the stowed configuration and an unlocked position to initiate self-deployment of the stored-energy connectors to move to the released-energy position to move the plurality of antenna assemblies to the deployed configuration.

9. The antenna array of claim 8, said plurality of antenna assemblies forming a planar array in space in the deployed configuration.

10. The antenna array of claim 8, wherein the plurality of stored-energy connectors self-assemble the plurality of antenna assemblies in space.

11. The antenna array of claim 8, wherein the plurality of antenna assemblies are flat.

12. The antenna array of claim 8, wherein the plurality of antenna assemblies are folded with respect to each other when in the stowed configuration and unfolded with respect to each other when in the deployed configuration.

13. The antenna array of claim 8, wherein each of the plurality of antenna assemblies have a communication side and a solar side, the communication side having one or more antenna elements communicating with Earth, and the solar side having one or more solar cells generating power.

14. The antenna array of claim 8, wherein the control mechanism comprises one or more of a solenoid, a coil, or a magnet.

15. The antenna array of claim 8, wherein the stored-energy connectors comprise tape springs.

16. The antenna array of claim 8,
wherein the first layer of the adjacent antenna assemblies comprises one or more antennas, and
wherein the second layer of the adjacent antenna assemblies comprises one or more solar cells.

\* \* \* \* \*